United States Patent
Dietl et al.

(10) Patent No.: US 6,885,077 B2
(45) Date of Patent: Apr. 26, 2005

(54) SCHOTTKY DIODE

(75) Inventors: Josef Dietl, München (DE); Hans Taddiken, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/619,012

(22) Filed: Jul. 11, 2003

(65) Prior Publication Data

US 2004/0012066 A1 Jan. 22, 2004

Related U.S. Application Data

(63) Continuation of application No. PCT/DE01/04906, filed on Dec. 27, 2001.

(30) Foreign Application Priority Data

Jan. 11, 2001 (DE) .......................................... 101 01 081

(51) Int. Cl.[7] ........................................... H01L 27/095
(52) U.S. Cl. ........................ 257/486; 257/109; 257/485
(58) Field of Search .......................... 257/109, 485–486

(56) References Cited

U.S. PATENT DOCUMENTS

| 3,508,125 A | | 4/1970 | Ertel et al. | |
| 4,292,643 A | * | 9/1981 | Kellner et al. | ............... 257/472 |
| 4,835,580 A | * | 5/1989 | Havemann et al. | ......... 257/478 |
| 4,871,686 A | * | 10/1989 | Davies | ........................ 438/328 |
| 4,874,714 A | | 10/1989 | Eklund | |
| 4,956,688 A | | 9/1990 | Honma et al. | |
| 5,030,930 A | * | 7/1991 | Sugai | ........................ 333/150 |
| 5,200,664 A | * | 4/1993 | Sugai | ..................... 310/313 R |

FOREIGN PATENT DOCUMENTS

| DE | 198 24 417 A1 | 12/1998 |
| GB | 1 539 784 | 2/1979 |
| JP | 60022357 | 2/1985 |
| JP | 2000174293 A | 6/2000 |

* cited by examiner

*Primary Examiner*—Allan R. Wilson
(74) *Attorney, Agent, or Firm*—Laurence A. Greenberg; Werner H. Stemer; Gregory L. Mayback

(57) ABSTRACT

A Schottky diode has a Schottky junction formed by a thin metal layer and/or metal silicide layer at the top side of a doped well in a semiconductor body or substrate. In contrast to the fabrication of low-impedance contacts on CMOS wells, a metal, to be precise titanium in the preferred embodiment, is applied not to a highly doped contact region but to the lightly doped semiconductor material of the doped well, for example an HV well for the fabrication of high-voltage transistors.

7 Claims, 3 Drawing Sheets

SCHOTTKY DIODE

CROSS-REFERENCE TO RELATED APPLICATION

This application is a continuation of coepending International Application No. PCT/DE01/04906, filed Dec. 27, 2001, which designated the United States, and was not published in English.

BACKGROUND OF THE INVENTION

Field of the Invention

The present invention relates to a Schottky diode that can be fabricated in the context of a CMOS process.

If a metal layer is applied as a surface contact to a weakly electrically conductively doped semiconductor material, a layer that is enriched or depleted with respect to charge carriers forms in an edge region—adjacent the metal—of the semiconductor material, depending on the type of materials used. In the case of a depletion edge layer, this metal-semiconductor contact thus obtained has properties that are comparable to a pn junction in semiconductor material. Such a diode-like metal-semiconductor contact was investigated by W. Schottky and is therefore referred to as a Schottky diode.

The Schottky diode has a reverse direction, characterized by high resistance, and a forward direction, in which the Schottky diode can be operated depending on the polarity of the applied voltage. Although the Schottky diode does not have the blocking capability of a conventional diode with pn junction, it is nonetheless distinguished by a small forward voltage. Therefore, there is a need for Schottky diodes in CMOS technology as well, specifically in the application in high-frequency circuits. However, it is difficult to fabricate Schottky diodes in the context of a CMOS process because the available semiconductor layers are generally doped too highly for a Schottky diode.

In the context of a CMOS process, for the fabrication of transistors, wells that are doped complementarily to one another are fabricated in a usually p-conducting semiconductor body or substrate. The n-doped wells are disposed in the semiconductor material of the substrate, while the p-doped wells are disposed in the n-doped wells. The volumes occupied by the doped wells extend in each case as far as the top side of the substrate. At the upper edges of the interfaces of the wells, that is to say at the top side of the substrate, insulating regions are formed by oxidation of the semiconductor material or as so-called STI regions (shallow trench isolation), and isolate the wells from one another at the top side of the substrate. For an electrical connection of a well, a metal contact is applied, which is preferably formed by a contact hole filling (via), that is to say a metallic filling of a contact hole (via hole) etched out in a dielectric layer above the well. In order to obtain a low-impedance junction between the metal of the contact and the semiconductor material, the contact is applied to a highly doped contact region that is formed in the well and has the same sign of the conductivity.

U.S. Pat. No. 4,874,714 to Eklund describes a method for fabricating a lateral Schottky diode in the context of a CMOS process. A silicide-semiconductor junction as Schottky diode on weakly n-doped semiconductor material is isolated from a low-impedance metal-semiconductor contact by a spacer on the top side of the semiconductor body.

German published, non-prosecuted patent application DE 198 24 417 A1 describes an integrable Schottky diode in which a low-impedance n-conducting layer is present within an n-type well, which layer is provided with a Schottky contact and is surrounded by a guard ring. The Schottky contact is configured as a ring around a central pn junction. Japanese patent application JP 2000174293 reveals that titanium silicide on semiconductor material is suitable for forming a Schottky diode.

SUMMARY OF THE INVENTION

It is accordingly an object of the invention to provide a Schottky diode that overcomes the hereinafore-mentioned disadvantages of the heretofore-known devices of this general type and that has an improved structure that can be realized without significant additional outlay in the context of a CMOS process.

With the foregoing and other objects in view, there is provided, in accordance with the invention, a Schottky diode including a semiconductor body, a weakly conductively doped well, a thin metallic layer, a contact region, and a layer or a metallic silicide layer. The semiconductor body or substrate has a top side. The weakly conductively doped well is formed in the semiconductor body or substrate. The thin metallic layer on the well is for forming a Schottky junction with lateral edges. The lateral edges are at least one of long, greatly curved, irregularly curved, ramified, and rimose. The contact region is highly doped for a low-impedance contact connection and has a lateral boundary in the doped well and a lattice-shaped structure, a finger-shaped structure, a comb-like structure, an irregularly curved edge, a ramified edge, or a rimose edge. The Schottky diode also includes one of a liner of a contact hole filling introduced into a contact hole in a dielectric layer covering the top side, a metal silicide layer disposed between the liner 7 and the doped well 2, and a liner on the metal silicide layer.

In accordance with a further object of the invention, the lateral edges of the Schottky junction and the lateral boundary of the highly doped contact region facing the Schottky junction have a constant distance therebetween.

In accordance with a further object of the invention, the doped well is a high-voltage n-type well or a high-voltage p-type well of a CMOS technology.

In accordance with a further object of the invention, the Schottky diode includes a further doped well and a further highly doped contact region. The further doped well contains the doped well and is doped for an opposite sign of electrical conductivity than the doped well. The further highly doped contact region is provided on the further doped well and has a same sign of conductivity as the further doped well.

In accordance with a further object of the invention, the Schottky diode includes the metal silicide layer and has a finger-shaped structure.

In accordance with a further object of the invention, the contact region is finger-shaped and is intermeshed in a comb-like manner with the metal silicide layer.

The Schottky diode according to the invention has a Schottky junction formed by a thin metal layer and/or metal silicide layer at the top side of a doped well in a semiconductor body or substrate. In contrast to the fabrication of low-impedance contacts on CMOS wells as described in the introduction, a metal, to be precise titanium in the preferred embodiment, is applied not to a highly doped contact region but to the lightly doped semiconductor material of the doped well, for example an HV well for the fabrication of high-voltage transistors.

The thin metal layer is preferably formed by a so-called liner which, in the case of a contact hole filling, serves as a barrier against outdiffusion of the semiconductor material into the metal and for improving the adhesion property of the contact on the semiconductor material. This liner is present as a thin layer on the semiconductor material or, in an alternative embodiment, on a likewise thin metal silicide layer above the semiconductor material. The electrical connections of the Schottky diode are formed by contact hole fillings on the top side of the substrate or by leads in the substrate.

The operating properties of the Schottky diodes are essentially governed by the current flow parallel to the surface of the substrate and are improved by fabricating the lateral edges of the Schottky junction such that they are as long as possible, in particular greatly curved: i.e. longer than a simple straight edge. The electrical connection to the lightly doped well via the highly doped contact regions is preferably effected in such a way that there is an essentially constant distance between the edge of the Schottky junction formed by the liner or the metal silicide layer and a lateral edge—facing the Schottky junction—of the highly doped contact region. The metal silicide layer and the highly doped contact region may, in particular, be patterned in a finger-shaped manner and be intermeshed with one another in a comb-like manner.

The Schottky diode according to the invention is described in more detail below using the examples illustrated in FIGS. 1 to 5.

Other features that are considered as characteristic for the invention are set forth in the appended claims.

Although the invention is illustrated and described herein as embodied in a Schottky diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
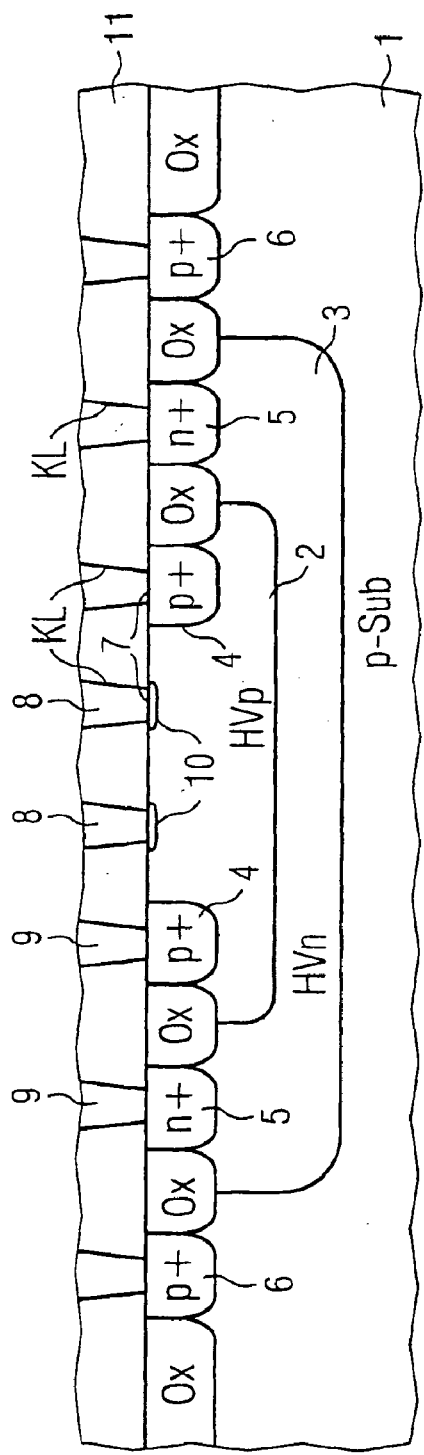
FIGS. 1 and 2 are fragmentary, diagramatic sectional views of embodiments of a Schottky diode according to the invention, FIG. 2 being a section taken along line II—II in FIG. 3.

Referring now to the figures of the drawings in detail and first, particularly to FIG. 1 thereof, there are shown doped wells 2, 3 that are formed in a semiconductor body or substrate 1 and are disposed one in the other. In this case, the substrate 1 is a p-conducting substrate, and the doped wells are a lower high-voltage n-type well HVn and a high-voltage p-type well HVp embedded therein, as are customary in the case of a CMOS process for the corresponding components. For the electrical connection of the inner doped well 2, at least one contact region 4 is present which is sufficiently highly doped, $p^+$-doped in this example, for a low contact resistance.

In this case, the doped well 2 is disposed in a further doped well 3, in which the semiconductor material is doped for the opposite sign of the conductivity, in this case n-conducting. In this example, for an electrical connection, the further doped well is provided with at least one highly doped contact region 5 having the same sign of the conductivity ($n^+$-doped) and permits shielding of the Schottky diode with respect to the substrate 1. The upper edges of the doped wells 2, 3 are provided with insulating regions Ox. The substrate 1 in this case has a contact region 6 for electrical connection that is $p^+$-doped.

In this example, the electrical connection of the Schottky diode is realized by contact hole fillings 8,9 introduced into contact holes KL in a dielectric layer 11 covering the top side 20 of the component. The contact hole fillings presuppose the application of a thin metal layer as liner 7. This liner 7 is present at the boundary between the contact hole fillings 8 and the doped well 2 as Schottky junction and between the contact hole fillings 9 and the highly doped contact regions 4, 5, 6 with the function that is known per se from CMOS processes. To form the Schottky diode, there may additionally be a metal silicide layer 10 between the liner 7 and the semiconductor material of the doped well 2.

Figure 2:
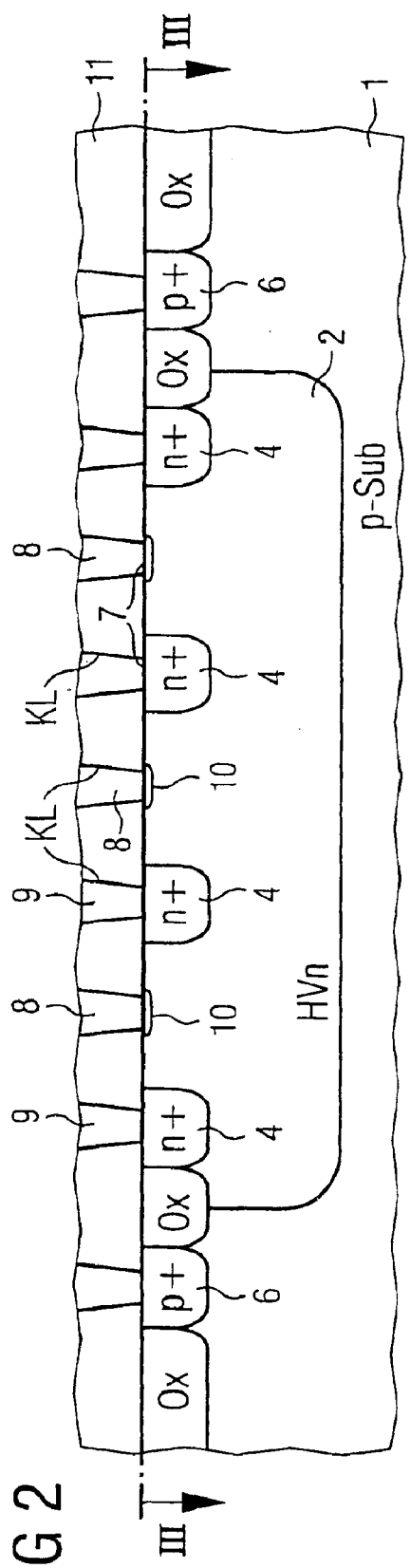

FIG. 2 illustrates an alternative exemplary embodiment, in which the Schottky diode is formed on a high-voltage n-type well HVn in a p-conducting substrate 1. In this case, the contact regions 4 of the doped well 2 are doped in a highly n-conducting manner. The configuration of the contact hole fillings 8 with which individual portions of the Schottky diode are formed is modified here relative to the configuration in the exemplary embodiment in accordance with FIG. 1. The reference symbols designate parts corresponding to those in FIG. 1.

The lateral edge of the Schottky junction is preferably constructed to be as long as possible. It is therefore favorable if, given the presence of the metal silicide layer 10, the edge thereof is patterned to the greatest possible extent in the layer plane. It is advantageous, moreover, if the lateral boundary of the contact regions 4 disposed in the doped well 2 has a similar structure, so that power is supplied to the Schottky junction all around at an approximately equally small distance (d).

Figure 3:
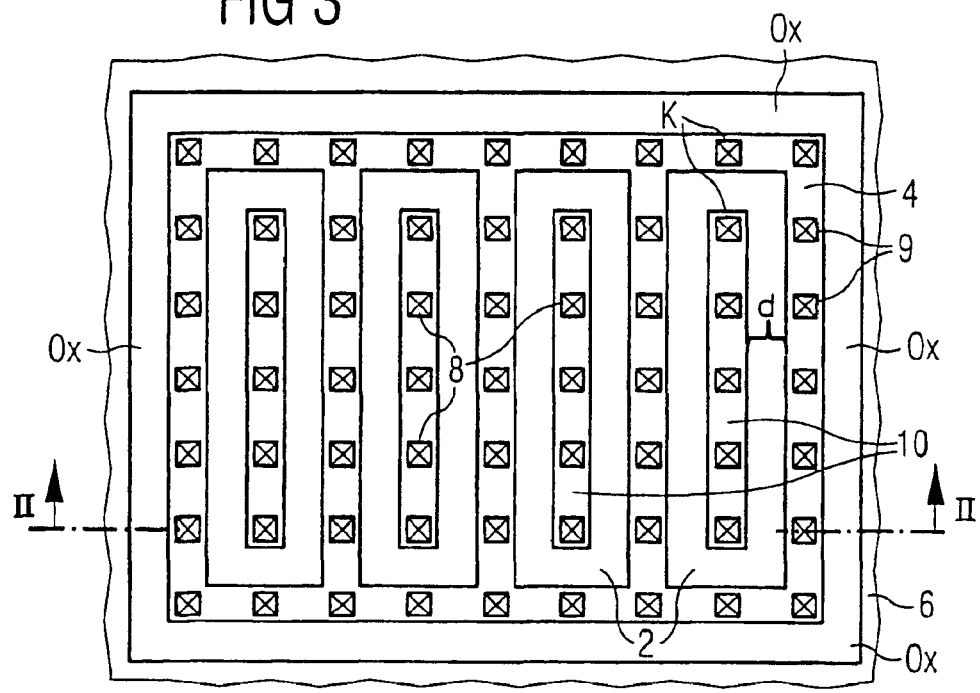
FIGS. 3 and 4 are fragmentary, plan views of the embodiment shown in FIG. 2, FIG. 3 being a section taken along line III—III in FIG. 2.

FIG. 3 illustrates a plan view of the structure in accordance with FIG. 2 in the position marked there. It can be seen from this that, in this exemplary embodiment, the contact region 4 is contiguous with the doped well 2 and forms a lattice. Strips of the metal silicide layer 10 are disposed between the portions of the lattice. The thin liners and contact hole fillings introduced into the contact holes form contacts X on the contact region 4 and on the metal silicide layer 10. The contacts on the metal silicide layer 10 form individual portions of the Schottky diode.

Figure 4:
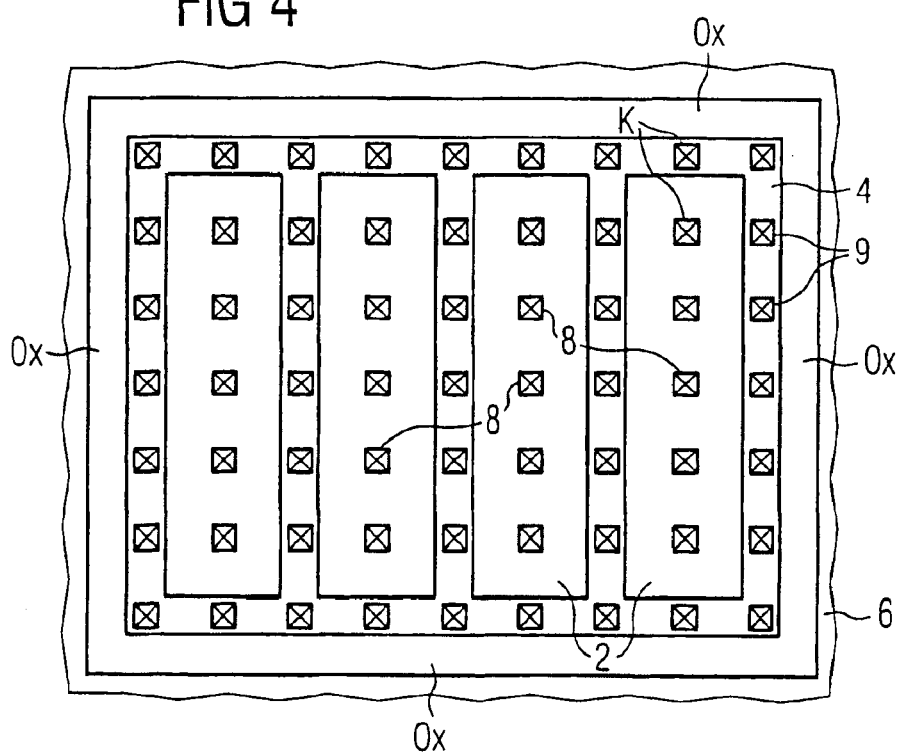

FIG. 4 illustrates an exemplary embodiment with the structure of the exemplary embodiment of FIG. 3, with the difference that the metal silicide layer 10 is omitted and the Schottky junction is formed by the liner on the lightly doped semiconductor material.

Figure 5:
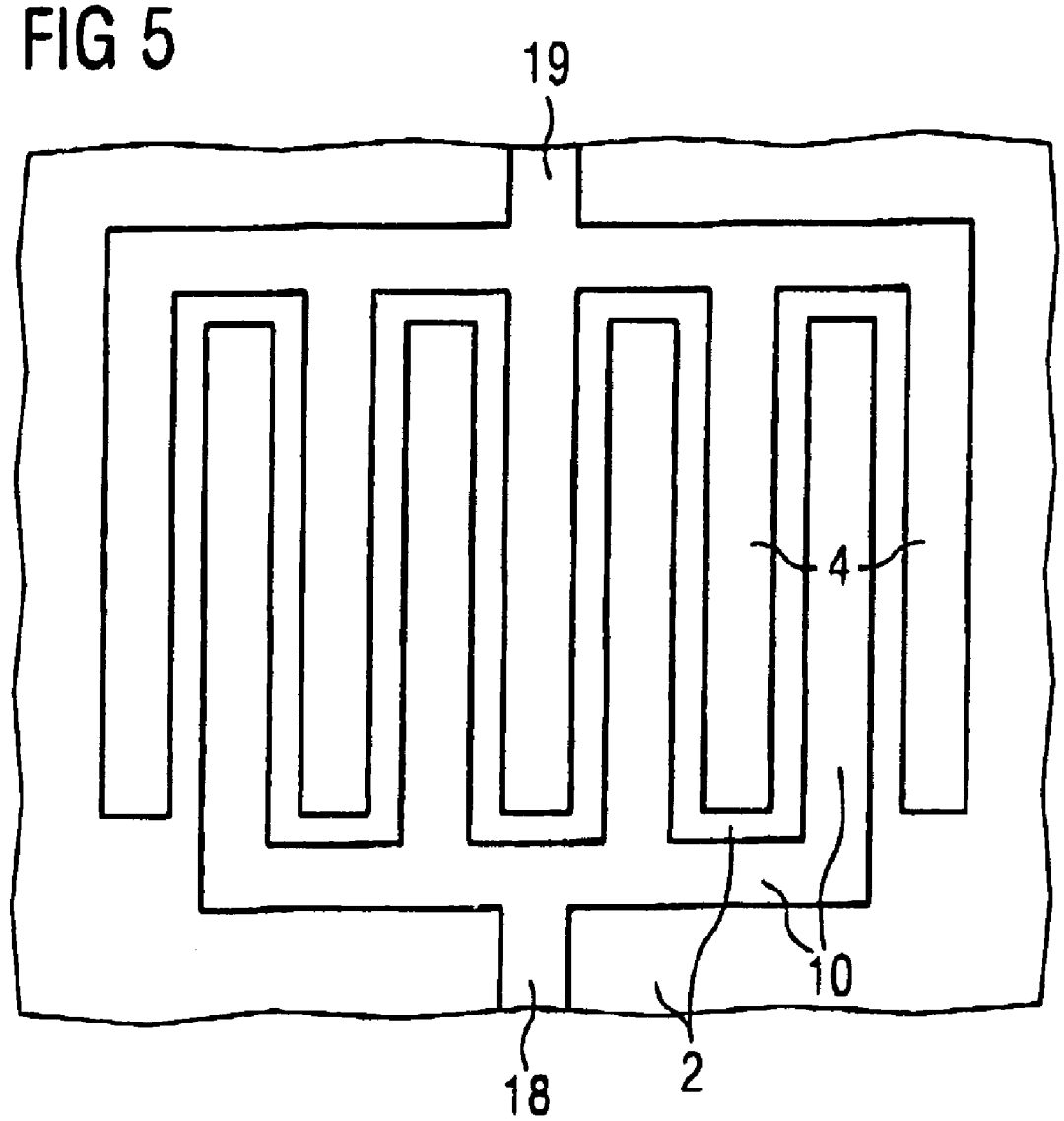
FIG. 5 is a fragmentary, plan view of a third embodiment of a Schottky diode.

FIG. 5 illustrates a further preferred structure of the Schottky diode according to the invention in a plan view. In this case, the metal silicide layer 10 is patterned in a finger-shaped manner. This structure is applied and embedded into the doped well 2 at the top side of the semiconductor body or substrate. In this case, the highly doped contact region 4 is preferably likewise of finger-shaped construction and intermeshed in a comb-like manner with the metal silicide layer 1.

In this exemplary embodiment, a lead 18, which is part of the patterned metal silicide layer 10, is preferably provided for the electrical connection. Current can be fed into the contact region 4 within the semiconductor material via a likewise highly doped further lead 19, which merges with the contact region 4. The leads 18, 19 may be routed to another part of the electronic circuit to which the Schottky diode belongs as a component, or, in a similar manner to the exemplary embodiment in accordance with FIG. 1, be provided with metallic contacts at the top side. In the latter case, the leads are preferably provided with suitable extensions as contact areas on which the metallic contacts are applied.

The distance between the edge of the metal silicide layer 10 and the contact region 4 is approximately uniformly small at all points in the case of the finger-shaped structure owing to the boundaries—running parallel to one another—of the metal silicide layer 10 and of the contact region 4. The lateral edge of the metal silicide layer 10 and, preferably at a small distance therefrom that is the same at all points, also the edge of the associated contact region may instead be constructed such that they are irregularly curved, ramified or rimose. If the metal silicide layer is absent, the same applies correspondingly to the edge of the Schottky junction formed by the liner and the contact hole filling on the semiconductor material of the doped well.

The edge of the junction acting as a Schottky diode should always have the longest possible overall length. The metallic layer of the Schottky diode may be a thin metal layer, in particular a liner of a contact hole filling, or a metal silicide layer or a liner on a metal silicide layer. In all the exemplary embodiments, the metal that is appropriate for the Schottky junction is preferentially titanium; a metal silicide layer is titanium silicide in this case.

We claim:

1. A Schottky diode, comprising:
   a semiconductor body having a top side;
   a weakly-conductive doped well formed in said semiconductor body;
   a metallic layer on said well for forming a Schottky junction with lateral edges delimiting said Schottky junction, said lateral edges being at least one of curved, ramified, and rimose;
   said metallic layer being at least one layer selected from the group of thin layers consisting of:
      a liner of a contact hole filling extending in a dielectric layer covering said top side,
      a metal silicide layer, and
      a liner on said metal silicide layer; and
   a contact region being highly doped for a low-impedance contact connection and having a lateral boundary in said doped well, said lateral boundary having one of a lattice-shaped structure, a finger-shaped structure, a comb-shaped structure, an irregularly curved edge, a ramified edge, and a rimose edge.

2. The Schottky diode according to claim 1, wherein said lateral edges of said Schottky junction and said lateral boundary of said highly doped contact region facing said Schottky junction have a constant distance therebetween.

3. The Schottky diode according to claim 1, wherein said doped well is selected from the group consisting of a high-voltage n-type well and a high-voltage p-type well of a CMOS technology.

4. The Schottky diode according to claim 1, further comprising:
   a further doped well containing said doped well and being doped for an opposite sign of electrical conductivity than said doped well; and
   a further highly doped contact region provided on said further doped well and having the same sign of conductivity as said further doped well.

5. The Schottky diode according to claim 1, wherein said metal layer has a finger-shaped structure.

6. The Schottky diode according to claim 5, wherein said contact region is finger-shaped and is intermeshed in a comb-shaped manner with the metal layer.

7. A Schottky diode, comprising:
   a semiconductor body having a top side;
   a dielectric layer covering said top side and having a contact hole formed therein;
   a contact hole filling disposed in said contact hole;
   a weakly-conductively doped well formed in said semiconductor body;
   a metallic layer on said well for forming a Schottky junction with lateral edges delimiting said Schottky junction, said lateral edges being at least one of curved, ramified, and rimose, said metallic layer being selected from the group of layers consisting of:
      a liner of said contact hole filling,
      a metal silicide layer, and
      a liner on said metal silicide layer; and
   a contact region being highly doped for a low-impedance contact connection and having a lateral boundary in said doped well, said lateral boundary having one of a lattice-shaped structure, a finger-shaped structure, a comb-like structure, an irregularly curved edge, a ramified edge, and a rimose edge.

* * * * *